(12) United States Patent
Hirose et al.

(10) Patent No.: US 10,381,290 B2
(45) Date of Patent: Aug. 13, 2019

(54) METHOD OF MANUFACTURING AN ELECTRONIC DEVICE

(71) Applicant: FUJITSU LIMITED, Kawasaki-shi, Kanagawa (JP)

(72) Inventors: Shinichi Hirose, Yokohama (JP); Daiyu Kondo, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 1 day.

(21) Appl. No.: 15/660,124

(22) Filed: Jul. 26, 2017

(65) Prior Publication Data

US 2018/0061736 A1 Mar. 1, 2018

(30) Foreign Application Priority Data

Aug. 25, 2016 (JP) ................. 2016-164678

(51) Int. Cl.
| | | |
|---|---|---|
| *H05K 3/30* | (2006.01) | |
| *H01L 23/373* | (2006.01) | |
| *F28F 13/18* | (2006.01) | |
| *F28F 21/02* | (2006.01) | |
| *H01L 21/48* | (2006.01) | |
| *H01L 23/367* | (2006.01) | |
| *H01L 23/043* | (2006.01) | |
| *H01L 23/10* | (2006.01) | |
| *B82Y 30/00* | (2011.01) | |
| *H01L 23/053* | (2006.01) | |
| *F28F 13/00* | (2006.01) | |

(52) U.S. Cl.
CPC .......... *H01L 23/3737* (2013.01); *F28F 13/18* (2013.01); *F28F 21/02* (2013.01); *H01L 21/481* (2013.01); *H01L 23/3675* (2013.01); *H01L 23/373* (2013.01); *B82Y 30/00* (2013.01); *F28F 2013/006* (2013.01); *F28F 2255/20* (2013.01); *H01L 23/043* (2013.01); *H01L 23/053* (2013.01); *H01L 23/10* (2013.01); *H01L 2224/16225* (2013.01); *H01L 2224/73253* (2013.01)

(58) Field of Classification Search
CPC .............. H01L 23/3737; H01L 21/481; H01L 23/3675; H01L 23/373; F28F 13/18; F28F 21/02; B82Y 30/00
See application file for complete search history.

(56) References Cited

U.S. PATENT DOCUMENTS

| | | | | |
|---|---|---|---|---|
| 2010/0124025 A1* | 5/2010 | Yamaguchi | ........... | H01L 23/373 361/708 |
| 2012/0218713 A1 | 8/2012 | Yamaguchi et al. | | |

(Continued)

FOREIGN PATENT DOCUMENTS

| | | |
|---|---|---|
| JP | 2005-150362 | 6/2005 |
| JP | 2006-147801 | 6/2006 |
| JP | 2006-303240 | 11/2006 |

(Continued)

*Primary Examiner* — Paul D Kim
(74) *Attorney, Agent, or Firm* — Fujitsu Patent Center

(57) ABSTRACT

A method of manufacturing an electronic device includes: placing a resin film on a component; and while heating the resin film to be softened, pressing end portions of a plurality of carbon nanotubes against the softened resin film to bring the end portions into contact with the component, and causing the softened resin film to climb up side surfaces of the carbon nanotubes.

6 Claims, 20 Drawing Sheets

(56) References Cited

U.S. PATENT DOCUMENTS

2012/0236502 A1 9/2012 Yamaguchi et al.
2012/0325454 A1* 12/2012 Iwai ..................... H01L 23/373
165/185

FOREIGN PATENT DOCUMENTS

| JP | 2010-118609 | 5/2010 |
|----|-------------|--------|
| JP | 2010-199367 | 9/2010 |
| JP | 2010-267706 | 11/2010 |
| JP | 2012-199335 | 10/2012 |
| JP | 2013-115094 | 6/2013 |
| JP | 2014-060252 | 4/2014 |

\* cited by examiner

METHOD OF MANUFACTURING AN ELECTRONIC DEVICE

CROSS-REFERENCE TO RELATED APPLICATION(S)

This application is based upon and claims the benefit of priority of the prior Japanese Patent Application No. 2016-164678, filed on Aug. 25, 2016, the entire contents of which are incorporated herein by reference.

FIELD

The embodiments discussed herein are related to a heat dissipating sheet, an electronic device, and a method of manufacturing the electronic device.

BACKGROUND

In a server and a personal computer, a heat spreader is attached to an electronic component such as a central processing unit (CPU) to dissipate heat generated in the electronic component to the outside.

When the thermal resistance between the heat spreader and the electronic component is high, heat in the electronic component cannot be transferred to the heat spreader quickly. For this reason, a heat dissipating sheet with excellent thermal conductivity is interposed between the electronic component and the heat spreader in some cases.

There are various types of heat dissipating sheets. An indium sheet is an example of the heat dissipating sheets. However, since the expensive indium is employed in the indium sheet, the cost of the heat dissipating sheets cannot be lowered. Moreover, indium has a thermal conductivity of 80 W/m·K, with which it is difficult to efficiently dissipate heat from an electronic component.

A thermal conductive polymer can be used as the heat dissipating sheet, but the thermal conductivity of a thermally conductive polymer is not sufficiently high.

To deal with these problems, a heat dissipating sheet using carbon nanotubes is under consideration as an alternative of the indium sheet and the thermally conductive polymer.

Carbon nanotubes have a thermal conductivity of about 1,500 W/m·K to 3,000 W/m·K, which is much higher than that of indium (50 W/m·K). Thus, carbon nanotubes are attractive for use in the heat dissipating sheet.

Although there are various proposed techniques for application of carbon nanotubes to a heat dissipating sheet, each of them have room for improvement.

For example, it is proposed to disperse carbon nanotubes into a resin to form the heat dissipating sheet. In this method, since the carbon nanotubes are oriented in various directions, it is difficult to transfer heat along the carbon nanotubes from the upper surface to the lower surface of the sheet.

Alternatively, it is also proposed to grow carbon nanotubes along the normal direction of the substrate, and then completely fill the spaces between the carbon nanotubes with resin. Since all the carbon nanotubes are oriented in substantially the same direction in this method, it is supposedly easy to transfer heat from the upper surface to the lower surface of the sheet along the carbon nanotubes.

In this method, however, resin is interposed between end portions of the carbon nanotubes and the electronic component, which increases the thermal resistance between the electronic component and the carbon nanotubes.

Note that techniques related to the present application are disclosed in the following literature:
Japanese Laid-open Patent Application No. 2005-150362;
Japanese Laid-open Patent Application No. 2006-147801;
Japanese Laid-open Patent Application No. 2006-303240;
Japanese Laid-open Patent Application No. 2010-118609;
Japanese Laid-open Patent Application No. 2010-267706;
Japanese Laid-open Patent Application No. 2012-199335;
Japanese Laid-open Patent Application No. 2010-199367;
Japanese Laid-open Patent Application No. 2013-115094; and
Japanese Laid-open Patent Application No. 2014-60252.

SUMMARY

According to one aspect discussed herein, there is provided a method of manufacturing an electronic device, the method including placing a resin film on a component; and while heating the resin film to be softened, pressing end portions of a plurality of carbon nanotubes against the softened resin film to bring the end portions into contact with the component, and causing the softened resin film to climb up side surfaces of the carbon nanotubes.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to describing the present embodiment, matters studied by the inventor of the present application are described.

FIGS. 1A to 1H are sectional views of the studied electronic device in the course of manufacturing thereof.

This electronic device employs a heat dissipating sheet formed by carbon nanotubes impregnated with resin as follows.

Figure 1A:
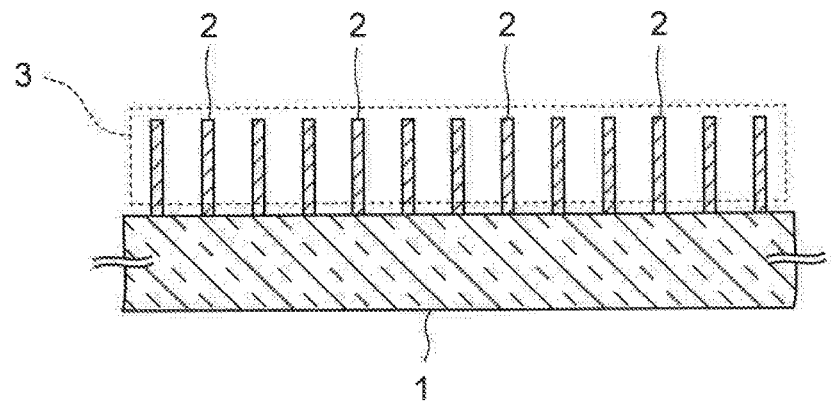
FIGS. 1A to 1H are sectional views of an electronic device in the course of manufacturing thereof, the device being used for a study.

First, as illustrated in FIG. 1A, a plurality of carbon nanotubes 2 are grown on a silicon substrate 1 by the hot-filament chemical vapor deposition (CVD) method, thereby obtaining a heat dissipating sheet 3 provided with a plurality of carbon nanotubes 2.

Figure 1B:
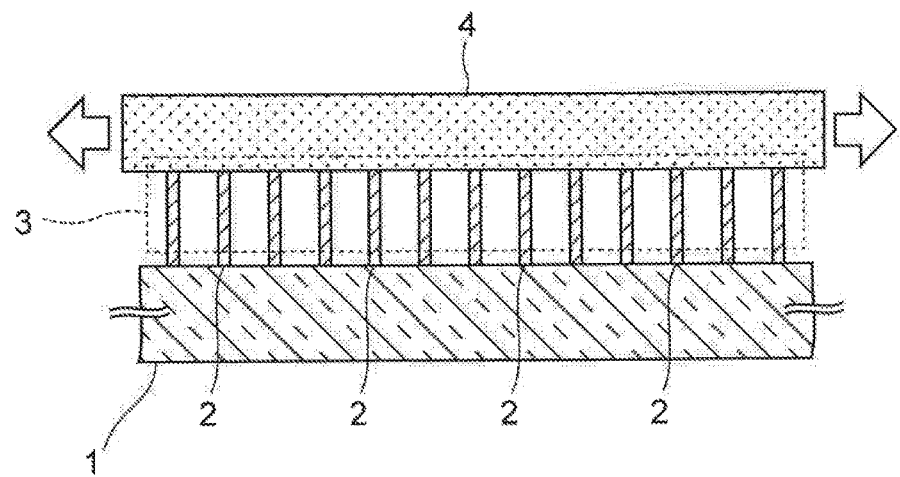

Next, as illustrated in FIG. 1B, a rubber sheet 4 stretched from its natural length is prepared. Examples of the material for the rubber sheet 4 include silicone rubber, natural rubber, and synthetic rubber.

Then, the rubber sheet 4 is pressed against the heat dissipating sheet 3, so that the rubber sheet 4 is fixed to the rubber sheet 4 by its adhesive force.

Figure 1C:
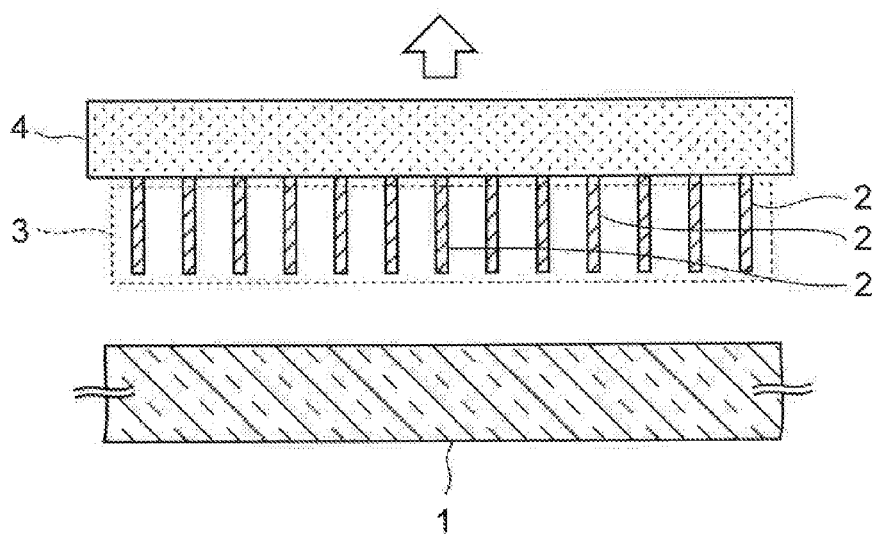

Next, as illustrated in FIG. 1C, while keeping the rubber sheet 4 to be stretched, the heat dissipating sheet 3 is peeled off from the substrate 1.

Figure 1D:
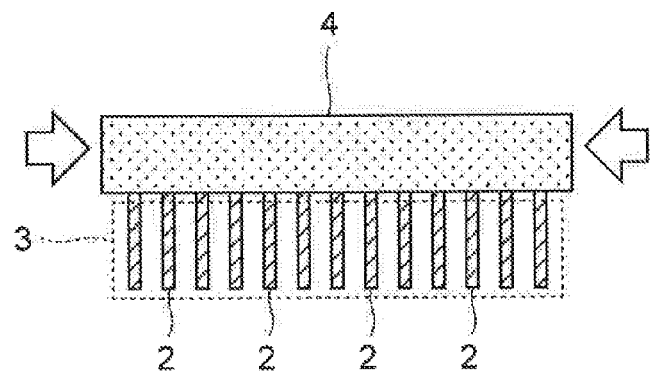

Thereafter, as illustrated in FIG. 1D, the stretched rubber sheet 4 is returned to its natural length. Thus, the interval of the carbon nanotubes 2 is narrowed by the contraction of the rubber sheet 4, so that the surface density of the carbon nanotubes 2 in the heat dissipating sheet 3 increases, which in turn increases the thermal conductivity of the heat dissipating sheet 3.

Figure 1E:
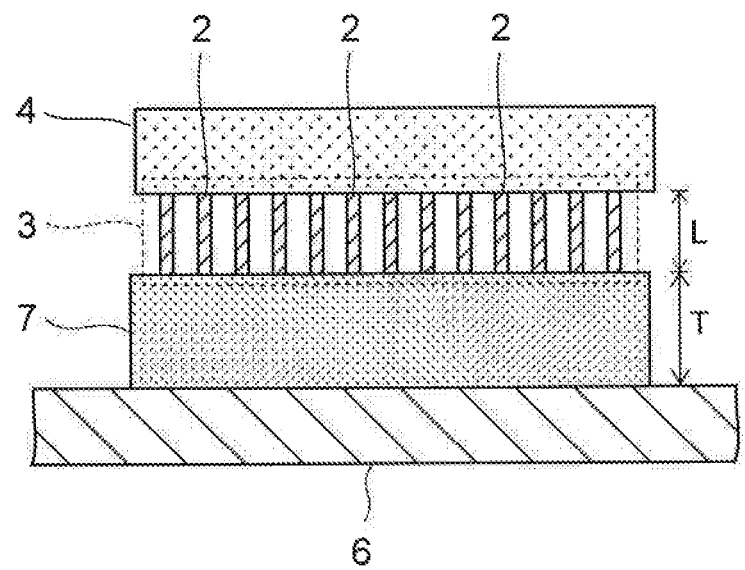

Next, as illustrated in FIG. 1E, a heat spreader 6 made of metal excellent in thermal conductivity such as copper is prepared, and resin 7 is fixed to a surface of the heat spreader 6.

In this example, a thermoplastic resin is used as the resin 7, and its thickness T is set to substantially the same length L of the carbon nanotubes 2.

Then, while heating the resin 7 to be softened by an unillustrated hot press machine, the heat dissipating sheet 3 is compressively attached to the resin 7. Thereafter, the resin 7 is cooled naturally to be solidified.

Figure 1F:
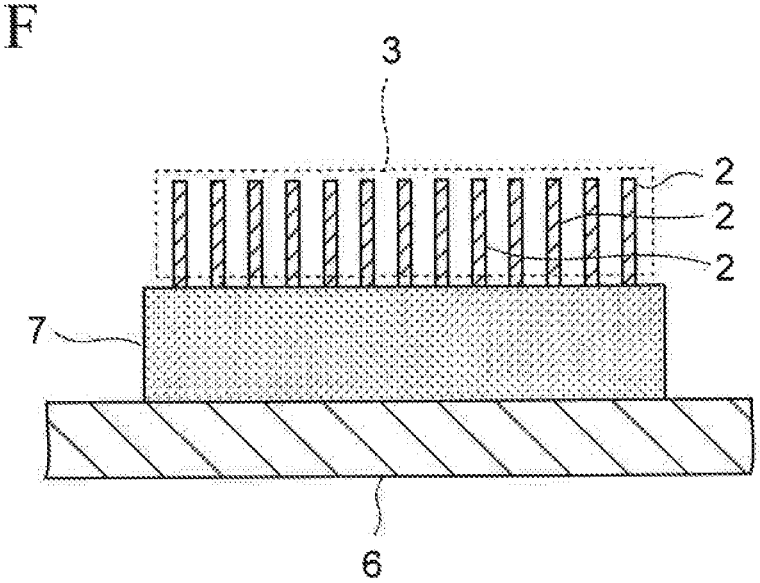

Subsequently, as illustrated in FIG. 1F, the rubber sheet 4 is peeled off from the heat dissipating sheet 3.

Figure 1G:
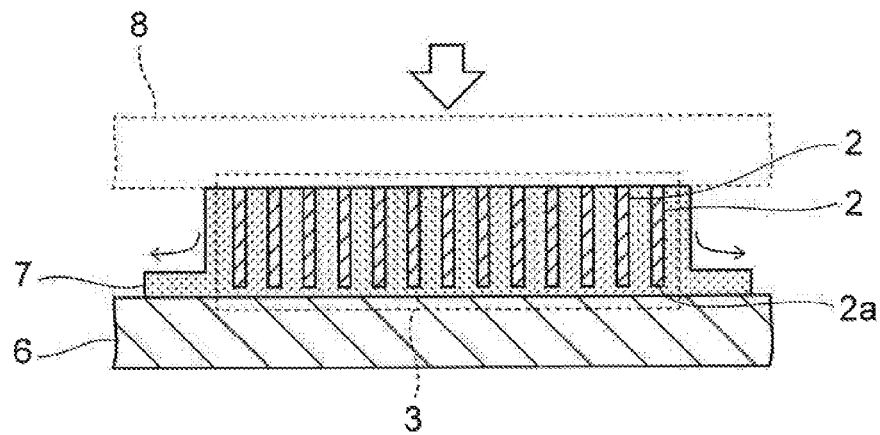

Next, as illustrated in FIG. 1G, while pressing a pressing plate 8 of a hot press machine against the heat dissipating sheet 3, the resin 7 is heated to be softened by a heater provided in the pressing plate 8, thereby embedding the carbon nanotubes 2 into the softened resin 7.

At this time, since the thickness T of the resin 7 is set to the substantially same length L of the carbon nanotubes 2 in this example as described above, the carbon nanotubes 2 can be embedded into the resin 7 over their entire length.

However, once the pressing plate 8 comes into contact with the resin 7, the resin 7 has nowhere to escape except in the substrate's lateral direction. Thus, there is no sufficient space for the resin 7 to escape, so that the resin 7 remains under end portions 2a of the carbon nanotubes 2 and is interposed between the end portions 2a and the heat spreader 6.

Figure 1H:
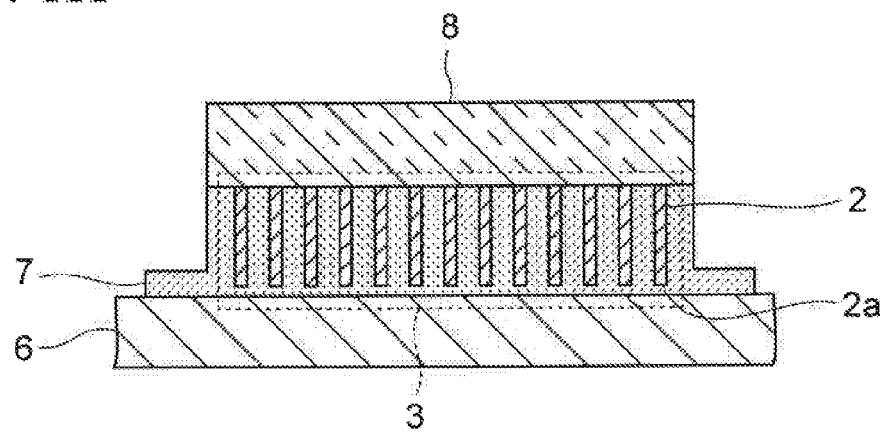

Thereafter, as illustrated in FIG. 1H, an electronic component 8 such as a CPU is placed on the resin 7. Then, while heating the resin 7 to be softened by an unillustrated hot press machine, the electronic component 8 is compressively attached to the heat dissipating sheet 3.

By these steps, the basic structure of the electronic device used for the study is completed.

According to this method of manufacturing the electronic device, the heat dissipating sheet 3 can be fixed to both the heat spreader 6 and the electronic component 8 by the adhesive force of the resin 7.

Moreover, since the thickness of the resin 7 is set to the substantially the same length of the carbon nanotubes 2, the resin 7 can prevent the carbon nanotubes 2 from being crushed by the force generated in the step of FIG. 1H when the electronic component 8 is compressively attached to the heat dissipating sheet 3.

However, when the resin 7 is made thick as the same length of the carbon nanotubes 2, the resin 7 cannot escape except in the substrate's lateral direction when the carbon nanotubes 2 are embedded into the resin 7 in the step of FIG. 1G.

As a result, the resin 7 remains between the end portions 2a of the carbon nanotubes 2 and the heat spreader 6, and hence the end portion 2a cannot be brought into contact with the heat spreader 6. In such a state, heat in the electronic component 8 cannot be transferred directly to the heat spreader 6 via the carbon nanotubes 2. Thus, the thermal resistance between the heat spreader 6 and the electronic component 8 increases, which cannot exploit the beneficial high conductivity of the carbon nanotubes 2.

In addition, according to the investigation conducted by the inventor of the present application, it was revealed that this method has following problem.

Figure 2B:
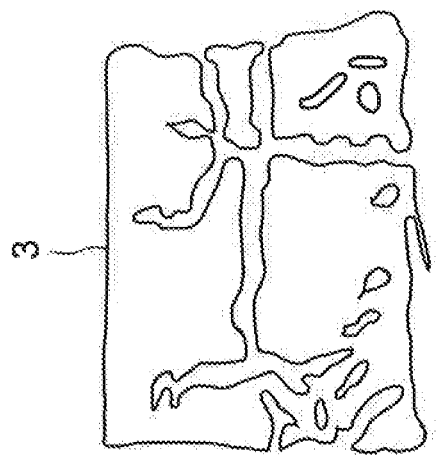
FIG. 2B is a diagram drawn based on a photograph of the heat dissipating sheet taken after the surface density of the carbon nanotubes is increased and then the heat dissipating sheet is impregnated with resin.
Figure 2A:
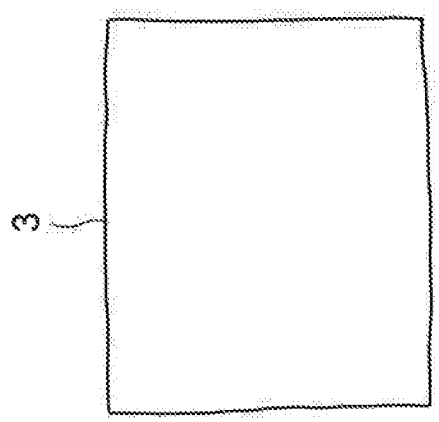
FIG. 2A is a diagram drawn based on a photograph of a heat dissipating sheet taken after the surface density of carbon nanotubes is increased.

FIGS. 2A and 2B are schematic plan views illustrating the problem.

FIG. 2A is a diagram drawn based on a photograph of the heat dissipating sheet 3 taken after the surface density of the carbon nanotubes 2 is increased by the step of FIG. 1D. Note that the heat dissipating sheet 3 is not impregnated with the resin 7 in this state.

As illustrated in FIG. 2A, the heat dissipating sheet 3 appears normal in this state.

On the other hand, FIG. 2B is a diagram drawn based on a photograph of the heat dissipating sheet 3 taken after the surface density of the carbon nanotubes 2 is increased by the step of FIG. 1D and then the heat dissipating sheet 3 is impregnated with the resin 7 by the step of FIG. 1G.

As illustrated in FIG. 2B, it was found that the heat dissipating sheet 3 cracks when the heat dissipating sheet 3 was impregnated with the resin 7 after increasing the surface density of the carbon nanotubes 2.

This is conceivably because when the resin 7 is impregnated into spaces between the carbon nanotubes 2 whose surface density is increased, the resin 7 exerts force against the carbon nanotubes 2 to widen the intervals between the carbon nanotubes 2.

When the heat dissipating sheet 3 is cracked in this manner, the thermal conductivity of the heat dissipating sheet 3 significantly decreases, and the heat dissipating sheet 3 cannot be put into practical use.

In the followings, embodiment capable of decreasing thermal resistance is described.

Embodiment

FIGS. 3A to 3L are sectional views of an electronic device in the course of manufacturing thereof according to the present embodiment.

Figure 3A:
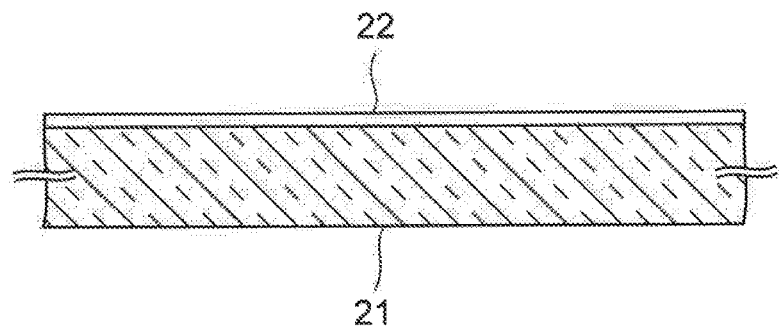
FIGS. 3A to 3L are sectional views of an electronic device in the course of manufacturing thereof according to the present embodiment.

First, as illustrated in FIG. 3A, a silicon substrate is prepared as a substrate 21. Then, the surface of the substrate 21 is thermally oxidized to form a silicon oxide film to a thickness of about 300 nm as an underlying film 22.

The material for the substrate 21 is not limited to silicon. A substrate made of any one of aluminum oxides, magnesium oxides, glass, and stainless steel may be used as the substrate 21. Moreover, instead of the rigid substrate 21, a metallic foil such as a stainless steel foil and an aluminum foil may be used.

Figure 3B:
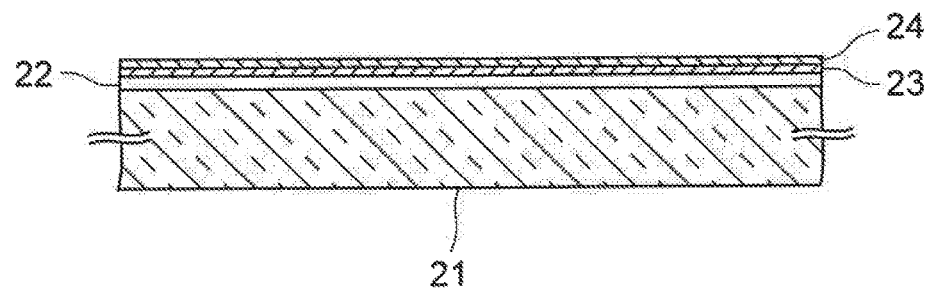

Next, as illustrated in FIG. 3B, an aluminum film is formed on the underlying film 22 by sputtering method to a thickness of about 10 nm, and the aluminum film is used as an underlying metal film 23.

Other than aluminum, the material for the underlying metal film 23 includes molybdenum, titanium, hafnium, zirconium, niobium, vanadium, tantalum, tungsten, copper, gold, platinum, palladium, titanium silicide, aluminum oxides, titanium oxides, and titanium nitride. Moreover, an alloy film containing any of these materials may be formed as the underlying metal film 23.

Next, an iron film is formed on the underlying metal film 23 by sputtering method to a thickness of about 2.5 nm as a catalytic metal film 24.

The material for the catalytic metal film 24 is not limited to iron. The catalytic metal film 24 may be famed of any one of iron, cobalt, nickel, gold, silver, platinum, and alloys of these materials.

Furthermore, instead of the catalytic metal film 24, metallic fine particles of the same material as the catalytic metal film 24 may be attached onto the underlying metal film 23. In this case, the metallic fine particles are sieved by a differential electrostatic classifier or the like, so that only ones with a predetermined diameter are supplied to the underlying metal film 23.

Figure 3C:
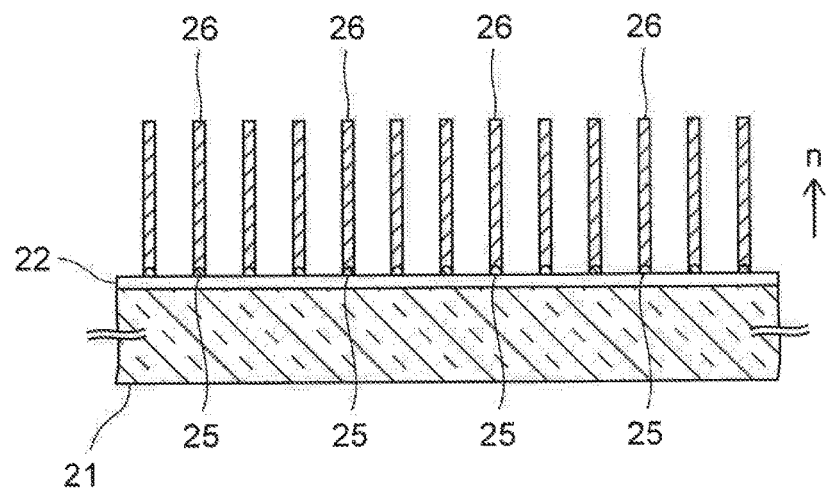

Subsequently, as illustrated in FIG. 3C, by using the catalytic action of the catalytic metal film 24, a plurality of carbon nanotubes 26 of about 100 μm to 500 μm long are grown by hot-filament CVD method. These carbon nanotubes 26 are grown straight along a normal direction n of the substrate 21 by the action of the underlying film 22.

Conditions for growing the carbon nanotubes 26 are not particularly limited. In this example, a mixed gas of acetylene gas and argon gas is used as a source gas, and the total gas pressure of the source gas in an unillustrated growth chamber is set to about 1 kPa. Note that the ratio of the acetylene gas and the argon gas is about 1:9 for example. The temperature of the hot filament is about 1,000° C., and the substrate temperature is about 620° C. to 660° C.

Under such growth conditions, the carbon nanotubes 26 grow at a speed of about 4 μm/min.

Note that the underlying metal film 23 and the catalytic metal film 24 are condensed into metal particles 25 when the source gas is introduced into the growth chamber, and the carbon nanotubes 26 grow only on these metal particles 25.

Under the growth conditions in this example, the surface density of the carbon nanotubes 26 is approximately $1 \times 10^{11}$ nanotubes/cm$^2$, with the diameter of each carbon nanotube 26 being 4 nm to 8 nm, approximately 6 nm in average.

In each carbon nanotube 26, about three to six graphene sheets are stacked from the center axis of the carbon nanotube 26 to its outside, and the average number of the graphene sheets becomes about four. Although such a carbon nanotube famed by stacking a plurality of graphene sheets is called a multilayered carbon nanotube, a single-layer nanotube may be formed in the alternative.

Method for growing the carbon nanotubes 26 is not limited to the hot-filament CVD, but may be thermal CVD method and remote plasma CVD method. Moreover, instead of acetylene, the source for carbon may be either hydrocarbon such as methane and ethylene, or alcohol such as ethanol and methanol.

The carbon nanotubes are not limited to those illustrated in this example, the height of the carbon nanotubes, surface density of the carbon nanotubes 26, the diameter of the carbon nanotubes 26, and the graphene sheet of the carbon nanotubes 26 may be approximately 50 μm to 5000 μm, approximately $1 \times 10^{10}$ nanotubes/cm$^2$ to $1 \times 10^{13}$ nanotubes/cm$^2$, approximately 2 nm to 50 nm, and about one to one hundred fifty, respectively.

Figure 3D:
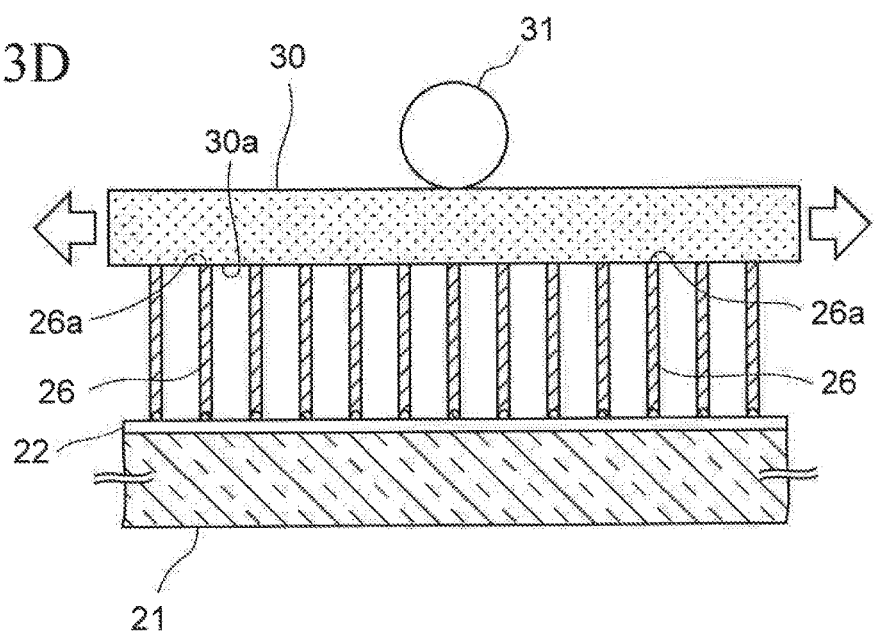

Next, as illustrated in FIG. 3D, a rubber sheet 30 stretched from its natural length is placed on one end portions 26a of the carbon nanotubes 26.

Then, a surface 30a of the rubber sheet 30 is pressed against the one end portions 26a of the carbon nanotubes 26 with a roller 31, so that the end portions 26a are fixed to the surface 30a by the adhesive force of the rubber sheet 30.

The material for the rubber sheet 30 is not particularly limited, and may be any rubber sufficiently adhesive to allow the carbon nanotubes 26 to be fixed thereto in this step. Examples of such a material include silicone rubber, natural rubber, and synthetic rubber.

Figure 4:
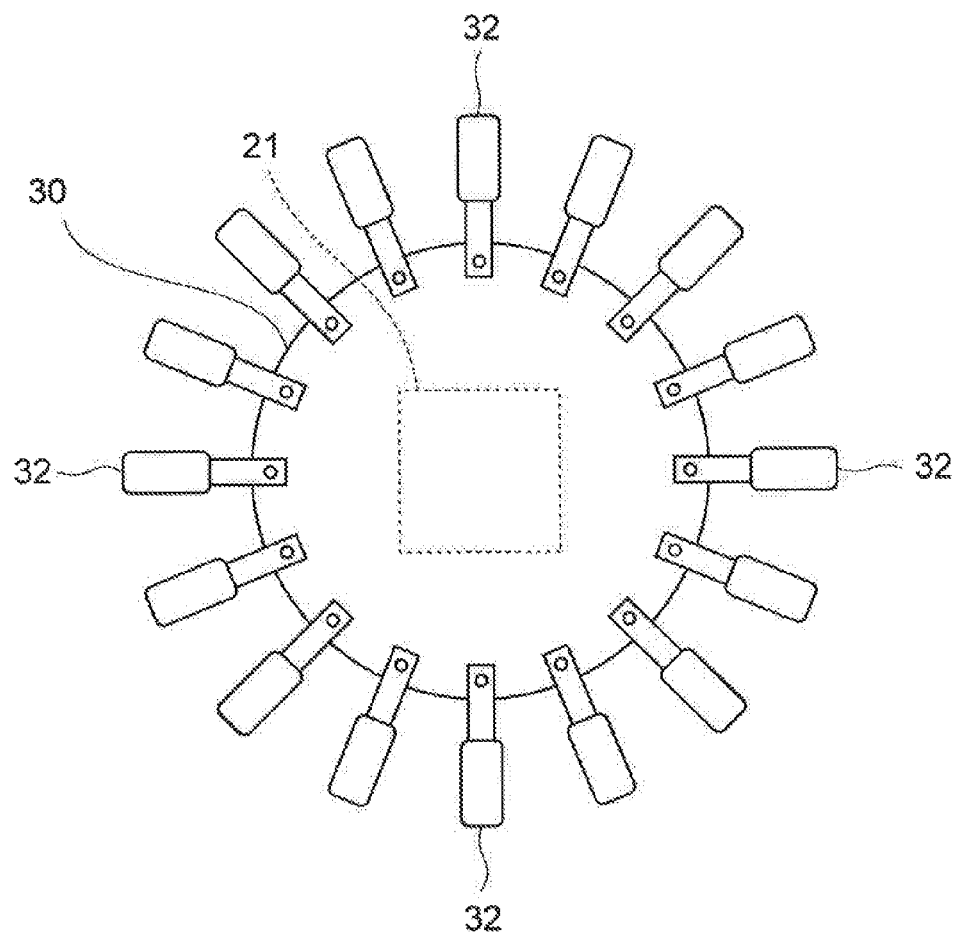
FIG. 4 is a plan view of a rubber sheet stretched in the present embodiment.

FIG. 4 is a plan view of the rubber sheet 30 stretched in this step.

As illustrated in FIG. 4, the rim of the rubber sheet 30 is gripped by a plurality of clips 32, and is stretched radially by these clips 32.

Figure 3E:
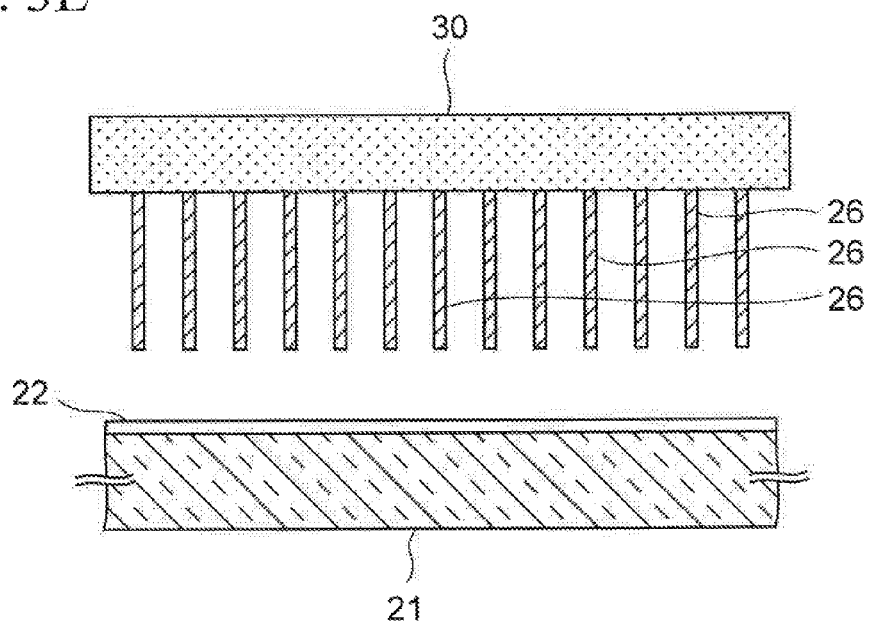

Subsequently, as illustrated in FIG. 3E, the carbon nanotubes 26 are peeled off from the substrate 21, and the carbon nanotubes 26 are transferred to the rubber sheet 30.

Figure 3F:
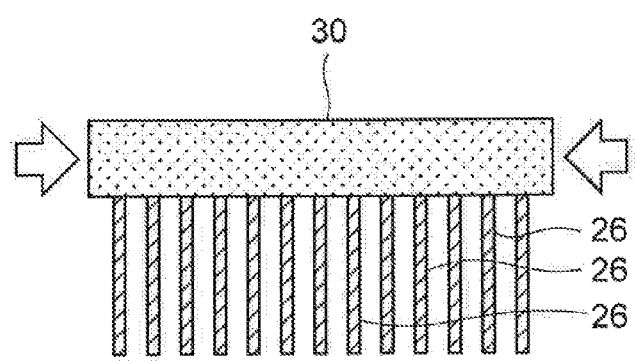

Then, as illustrated in FIG. 3F, the stretched rubber sheet 30 is relaxed by its elastic force. Thus, the intervals between the carbon nanotubes 26 are narrowed by the contraction of the rubber sheet 30, thereby increasing the surface density of the carbon nanotubes 26.

The contraction amount of the rubber sheet 30 is not particularly limited. In this example, the rubber sheet 30 is contracted in a manner that the area of the rubber sheet 30 shrinks to about one third of that before this step, thereby increasing the surface density of the carbon nanotubes 26 as three times higher than that before this step.

Figure 3G:
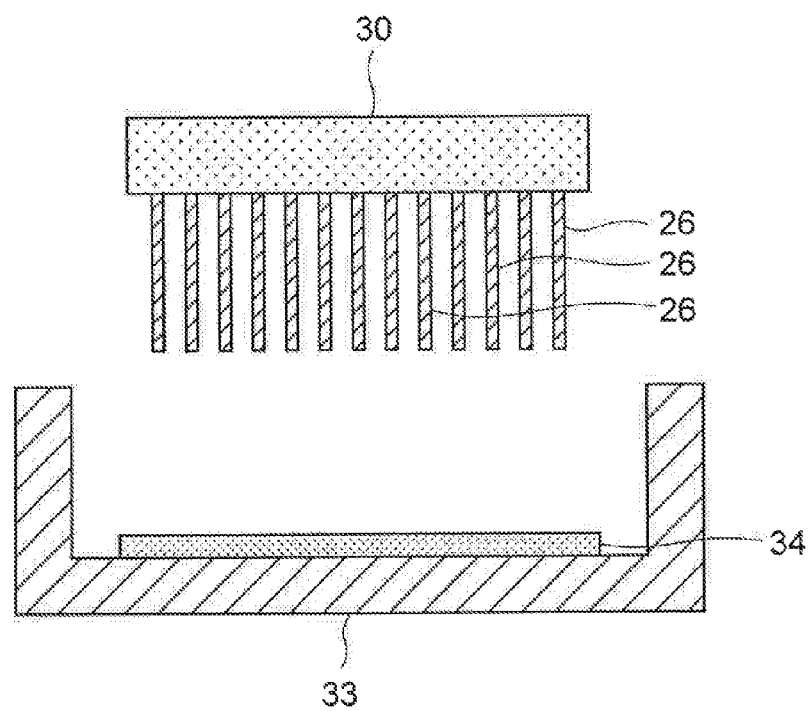

Next, as illustrated in FIG. 3G, a heat spreader is prepared as a first component 33, and a first resin film 34 is placed on a surface of the first component 33. The material and the thickness of the first resin film 34 are not particularly limited. In this example, an epoxy-based thermosetting resin film with the thickness of about 5 μm to 10 μm is used as the first resin film 34.

The melting point of the first resin film 34 is about 170° C., and the thermosetting temperature thereof is about 160° C. to 180° C.

Then, while heating the first resin film 34 to its melting point (170° C.) by an unillustrated hot press machine, the first resin film 34 is pressed onto the first component 33, thereby attaching the first resin film 34 to the first component 33.

Thereafter, the rubber sheet 30 described above is placed over the first resin film 34, so that the carbon nanotubes 26 transferred to the rubber sheet 30 face the first resin film 34.

Figure 3H:
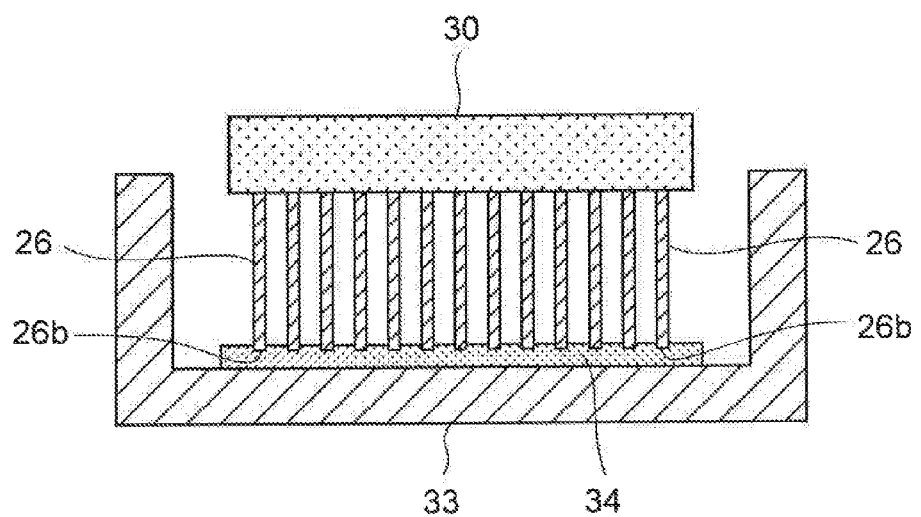

Subsequently, as illustrated in FIG. 3H, while heating the first resin film 34 by an unillustrated hot press machine, the other end portions 26b of the carbon nanotubes 26 are pressed against the first resin film 34, thereby fixing the end portions 26b to the first resin film 34.

The heating temperature in this step is not particularly limited. In this example, the first resin film 34 is heated to its melting point of about 170° C. Thus, the first resin film 34 can be softened sufficiently, making it easy to fix the carbon nanotubes 26 to the first resin film 34.

Thereafter, the first resin film 34 is naturally cooled to room temperature to be solidified.

Figure 3I:
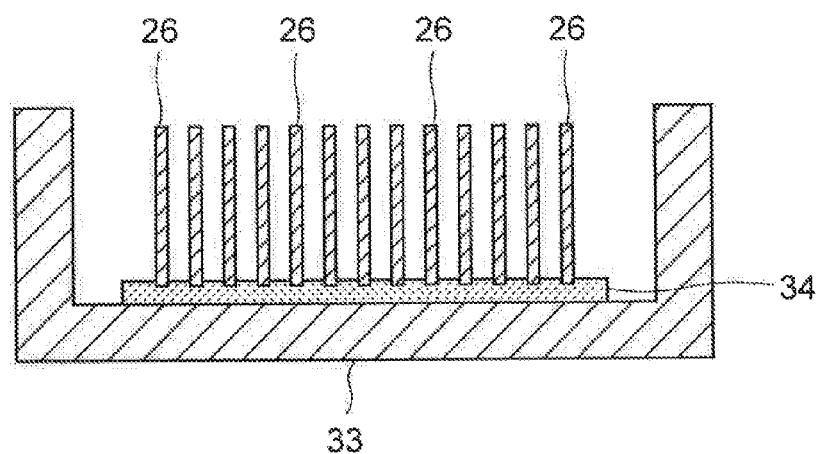

Next, as illustrated in FIG. 3I, the rubber sheet 30 is peeled off from the carbon nanotubes 26.

Figure 3J:
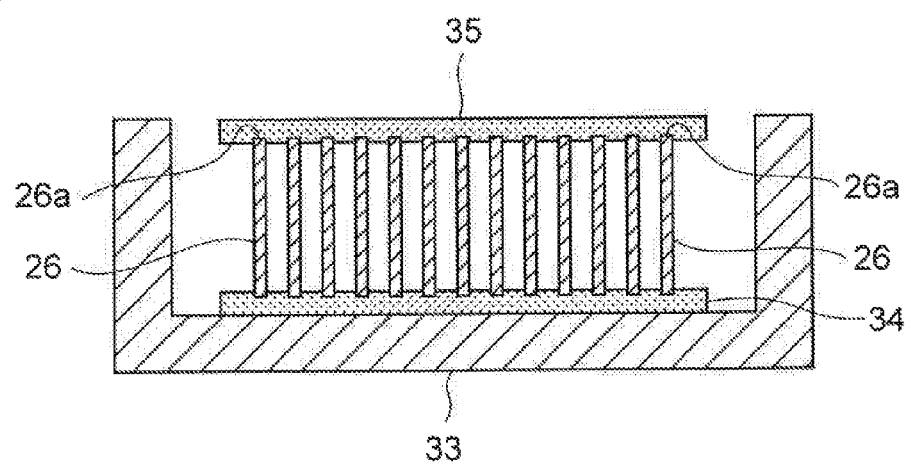

Subsequently, as illustrated in FIG. 3J, a second resin film 35 is placed on the one end portions 26a of the carbon nanotubes 26.

The material and thickness of the second resin film 35 are not particularly limited. In this example, like the first resin film 34, an epoxy-based thermosetting resin film with a thickness of about 5 μm to 10 μm is used as the second resin film 35.

The melting point and the thermosetting temperature of the second resin film 35 are the same as those of the first resin film 34. That is, the melting point of the second resin film 35 is about 170° C., and its thermosetting temperature is about 160° C. to 180° C.

Then, while heating the second resin film 35 to its melting point (170° C.) by an unillustrated hot press machine, the second resin film 35 is pressed against the one end portions 26a of the carbon nanotube 26, thereby attaching the second resin film 35 to the one end portions 26a.

Figure 3K:
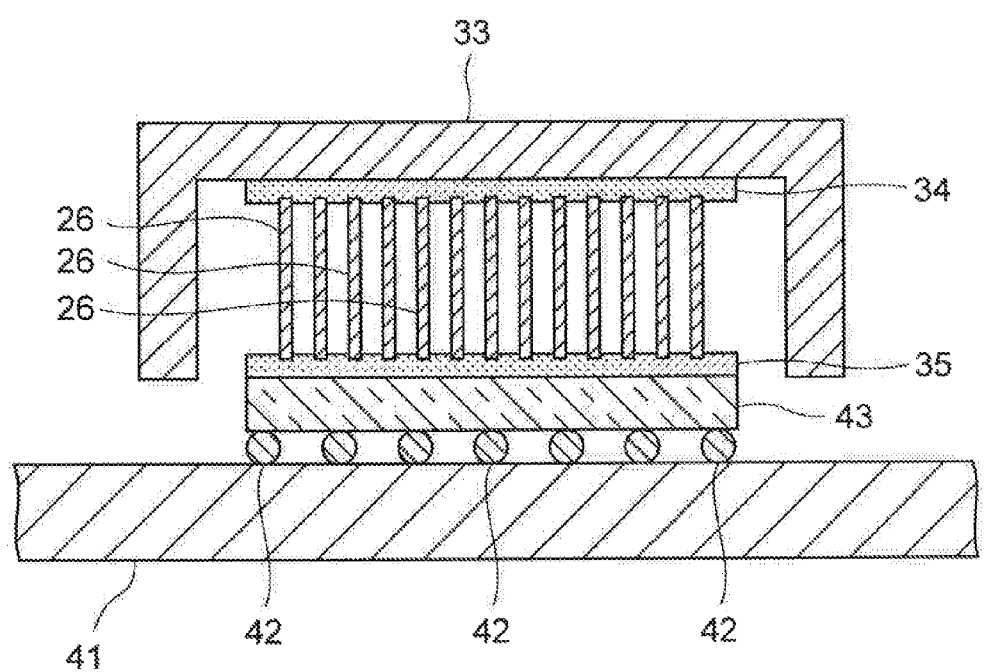

Next, the step illustrated in FIG. 3K is described.

First, a wiring substrate 41 on which a second component 43 is mounted is prepared, and is positioned so that the second component 43 faces the first component 33.

The second component 43 is a semiconductor element, such as a CPU, that generates heat during its operation, and is mounted on the wiring substrate 41 by solder bumps 42.

Then, after the first component 33 and the second component 43 are aligned, the second resin film 35 is brought into close contact with the second component 43.

Figure 3L:
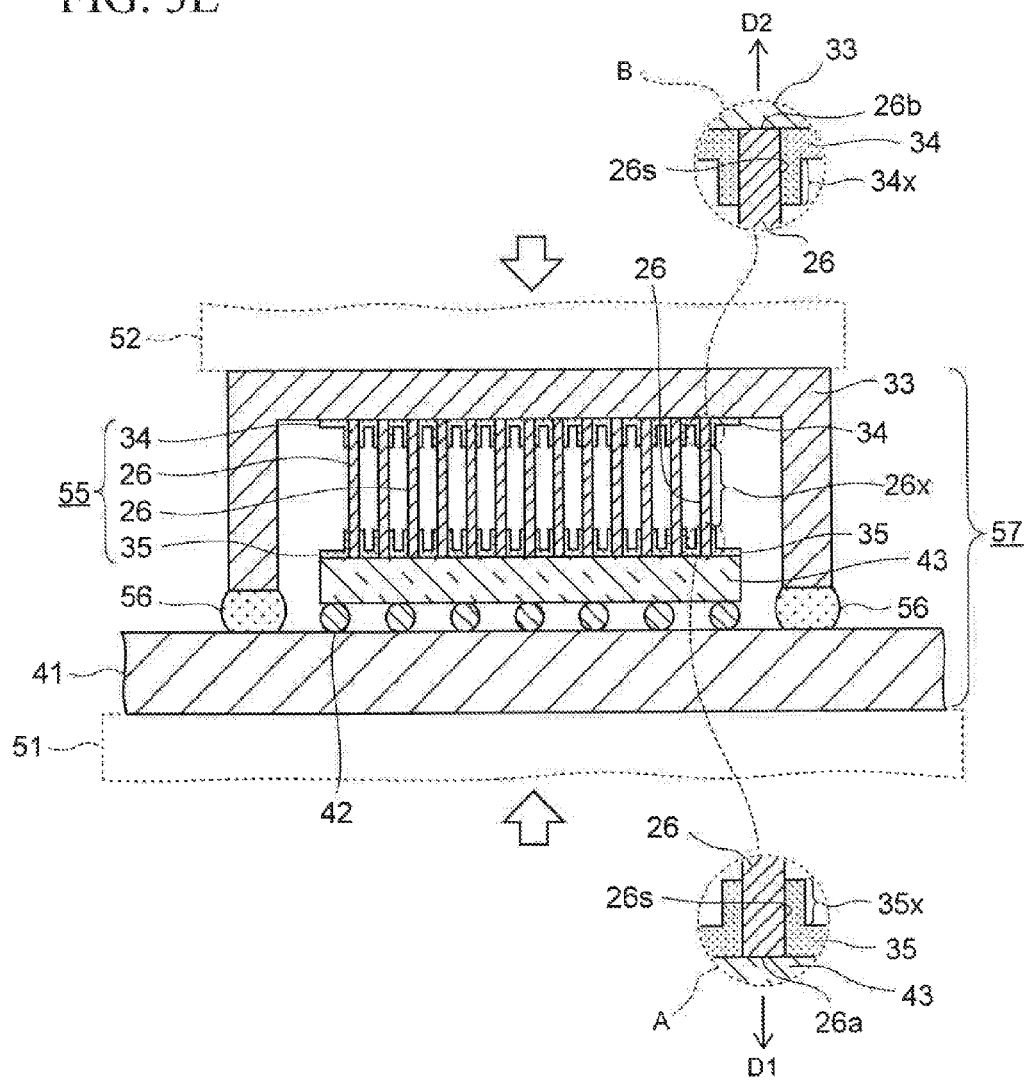

Next, as illustrated in FIG. 3L, the wiring substrate 41 is placed between a first pressing plate 51 and a second pressing plate 52 of a hot press machine.

Then, the first resin film 34 and the second resin film 35 are heated to their melting point (170° C.) and softened by an illustrated heater embedded in the pressing plates 51 and 52. Simultaneously, the wiring substrate 41 and the first component 33 are pressed with the pressing plates 51 and 52, so that the end portions 26a, 26b of the carbon nanotubes 26 are pressed against the resin films 35 and 34, respectively.

By performing this step, as illustrated in a dotted-line circle A, the one end portions 26a of the carbon nanotubes 26 penetrate the second resin film 35 in its thickness direction D1 and come into contact with a surface of the second component 43. Then, by the capillary force acting from the carbon nanotubes 26 to the second resin film 35, the softened second resin film 35 climbs up the side surfaces 26s of the carbon nanotubes 26, thereby forming climb portions 35x of the second resin film 35.

Similarly, as illustrated in a dotted-line circle B, the other end portions 26b of the carbon nanotubes 26 penetrate the first resin film 34 in its thickness direction D2 and come into contact with a surface of the first component 33. Then, the softened first resin film 34 climbs up the side surfaces 26s of the carbon nanotubes 26, climb portions 34x is formed in the first resin film 34.

Then, by maintaining this state for approximately 30 minutes, the softened resin films 34 and 35 are thermally cured.

By the steps so far, the basic structure of a heat dissipating sheet 55 including the carbon nanotubes 26 and the opposing resin films 34 and 35 is completed. The heat dissipating sheet 55 is fixed to the first component 33 and the second component 43 by the adhesive forces of the resin film 34 and the resin film 35, respectively.

Note that the end portions of the first component 33, which is a heat spreader, are bonded to the wiring substrate 41 with an adhesive 56 in this step.

By these steps, an electronic device 57 according to the present embodiment is completed.

In the electronic device 57, the heat generated in the second component 43 is transferred to the first component 33, which is the heat spreader, via the heat dissipating sheet 55, so that the heat dissipation of the second component 43 is promoted Especially, the carbon nanotubes 26 in the heat dissipating sheet 55 are excellent in their thermal conductivity. Therefore, heat generated in the second component 43 is quickly transferred through the heat dissipating sheet 55, so that the second component 43 is cooled efficiently.

Furthermore, an intermediate portion 26x of the carbon nanotube 26, which is a portion of the carbon nanotube 26 excluding the end portions 26a and 26b, is uncovered with the resin films 34 and 35 and exposed from these resin films 34 and 35. Therefore, the flexibility of the carbon nanotubes 26 is not reduced due to the resin films 34 and 35. As a result, even when the distance between the first component 33 and the second component 43 changes due to heat generated in the second component 43, the carbon nanotubes 26 can flexibly deform to accommodate to that change, allowing the components 33 and 43 to be kept connected via the heat dissipating sheet 55.

Moreover, the thickness of the second resin film 35 is sufficiently thinner than the length of the carbon nanotubes 26 in the present embodiment.

Therefore, the second resin film 35 softened in the step of FIG. 3L escapes along the side surface 26s of the carbon nanotube 26, so that the second resin film 35 is unlikely to remain between the one end portion 26a of the carbon nanotube 26 and the second component 43.

As a result, the one end portion 26a of the carbon nanotube 26 comes into contact with the second component 43, whereby it is prevented that the thermal resistance between the end portion 26a and the second component 43 increases due to the second resin film 35.

For the same reason, the other end portions 26b of the carbon nanotube 26 comes into contact with the first component 33, whereby it is prevented that the thermal resistance between the end portion 26b and the first component 33 increases due to the first resin film 34.

The inventor of the present application investigated how much the thermal resistance of the heat dissipating sheet 55 decreases by excluding the resin films 34 and 35 from the end portions 26a and 26b.

Figure 5:
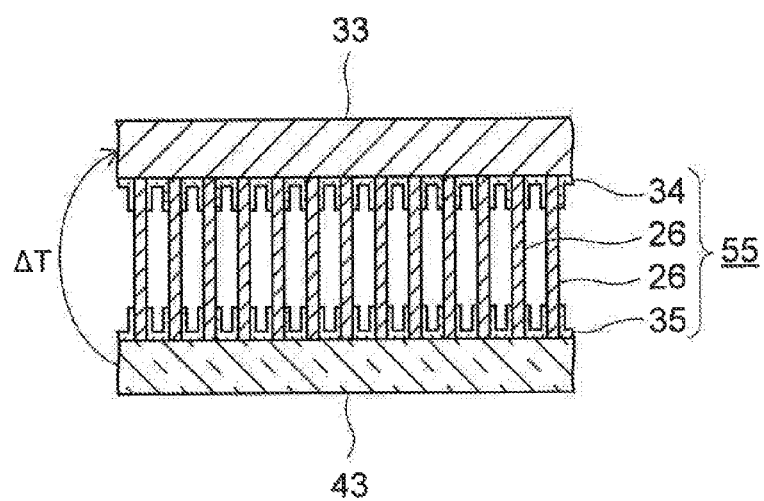
FIG. 5 is a sectional view illustrating how the thermal resistance of a heat dissipating sheet according to the present embodiment was investigated.

FIG. 5 is a sectional view illustrating a method of this investigation.

In this investigation, while making the second component 43 generate heat, the temperature difference ΔT between the first component 33 and the second component 43 was measured.

The higher the thermal conductivity of the heat dissipating sheet 55, the smaller the temperature difference ΔT. Therefore, the temperature difference ΔT serves as an index to estimate the thermal conductivity of the heat dissipating sheet 55.

Moreover, in this investigation, a plurality of samples with different thicknesses of the resin films 34 and 35 were prepared, and the temperature difference ΔT was measured for each sample.

Figure 6:
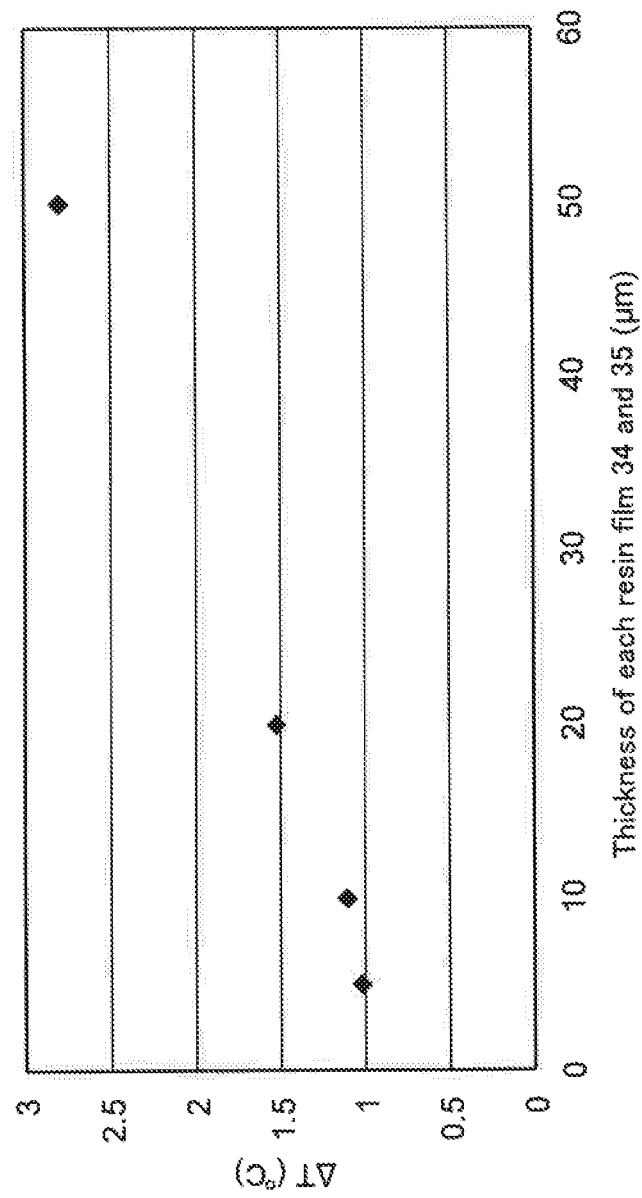
FIG. 6 is a diagram depicting results of an investigation on the relation between the thickness of resin films and the temperature difference in the heat dissipating sheet in the present embodiment.

FIG. 6 depicts the results of the investigation.

The horizontal axis in FIG. 6 represents the thickness of the resin films 34 and 35 before the resin films 34 and 35 are softened by the step of FIG. 3L. Note that the first resin film 34 and the second resin film 35 have the same thickness in the same sample.

The vertical axis in FIG. 6 represents the temperature difference ΔT described above.

As illustrated in FIG. 6, the temperature difference ΔT increases as the thickness of the resin films 34 and 35 increases.

This is because when the second resin film 35 becomes thicker for example, the second resin film 35 softened in the step of FIG. 3L has less space for escape and is more likely to remain between the one end portions 26a of the carbon nanotubes 26 and the second electronic component 43.

Therefore, in order to decrease the thermal difference between the components 33 and 43 by lowering the temperature difference ΔT, it is preferable that the resin films 34 and 35 are thin as possible.

However, when the resin films 34 and 35 are too thin, adhesiveness between the resin films and the components 33 and 43 is deteriorated, so that the heat dissipating sheet 55 may peel off from the components 33 and 43.

Such a problem becomes prominent when the thickness of the resin films 34 and 35 before softened in the step of FIG. 3L is thinner than 2 μm. Therefore, in order to improve the reliability of the electronic device 57 by preventing the heat dissipating sheet 55 from peeling off from the components 33 and 43, it is preferable that the thickness of the resin films 34 and 35 before softened in the step of FIG. 3L is equal to or thicker than 2 μm.

Moreover, the inventor of the present application prepared samples of the heat dissipating sheet 55 whose resin films 34 and 35 is different in thickness for each sample, and observed the appearance of each sample using a scanning electron microscope (SEM). The observation results are described below.

Figure 7B:
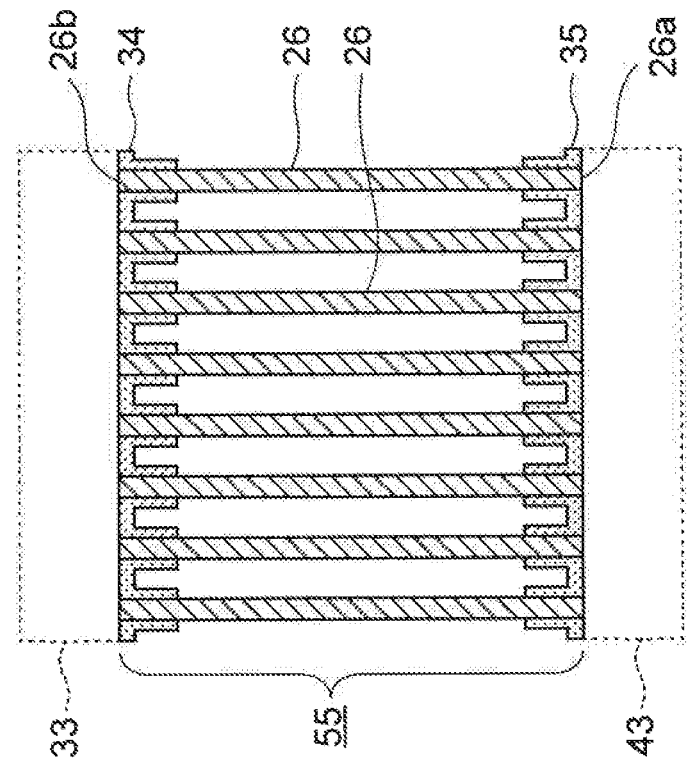
FIG. 7B is a schematic sectional view of the heat dissipating sheet according to the present embodiment having resin films whose thicknesses are 5 μm.
Figure 7A:
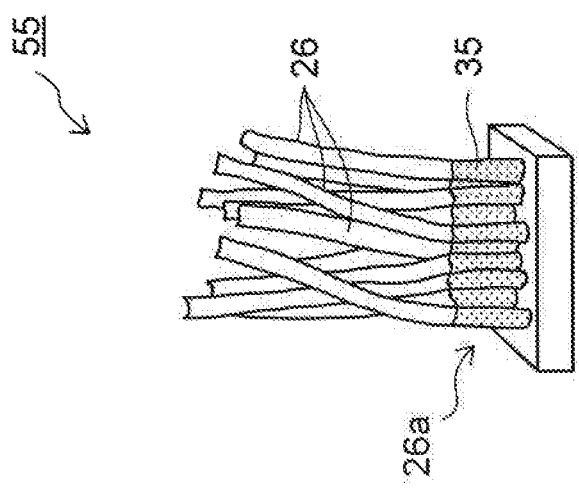
FIG. 7A is a diagram drawn based on a scanning electron microscopic (SEM) image of a heat dissipating sheet according to the present embodiment having resin films whose thicknesses are 5 μm.

FIG. 7A is a diagram drawn based on an SEM image of a heat dissipating sheet 55 in which the thicknesses of the resin films 34 and 35 are 5 μm. Note that the thicknesses of the resin films 34 and 35 in this investigation indicate the thicknesses of the resin films 34 and 35 before softened in the step of FIG. 3L. This is also the case for the following FIGS. 8A to 9B.

As illustrated in FIG. 7A, in this case, although the one end portion 26a of the carbon nanotube 26 is covered with the second resin film 35, the portion of the carbon nanotube 26 locating higher than the one end portion 26a is uncovered with the second resin film 35 and exposed from the second resin film 35.

FIG. 7B is a schematic sectional view of the heat dissipating sheet 55 in this case.

As illustrated in FIG. 7B, the one end portion 26a of the carbon nanotube 26 is in contact with the second component 43, and the other end portion 26b is in contact with the first component 33.

Figure 8B:
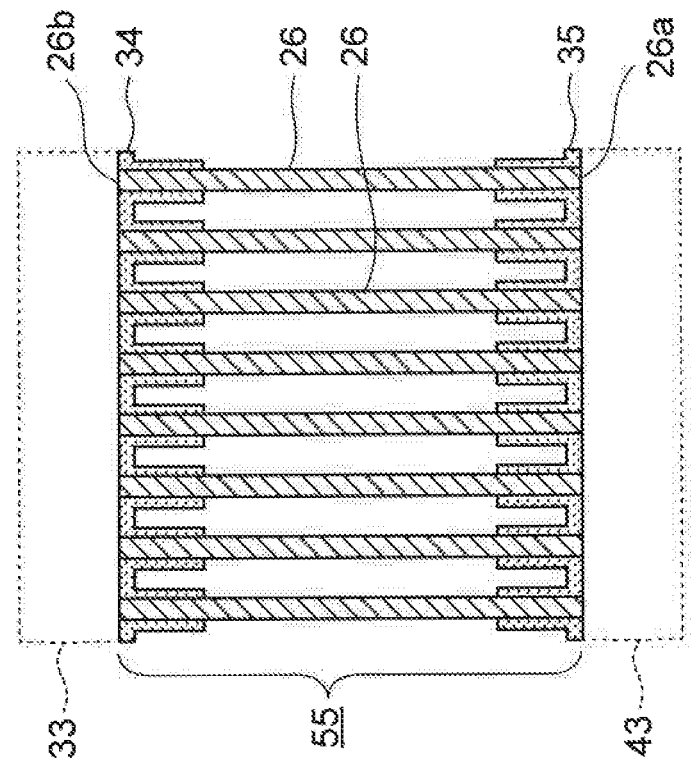
FIG. 8B is a schematic sectional view of the heat dissipating sheet according to the present embodiment having resin films whose thicknesses are 10 μm.
Figure 8A:
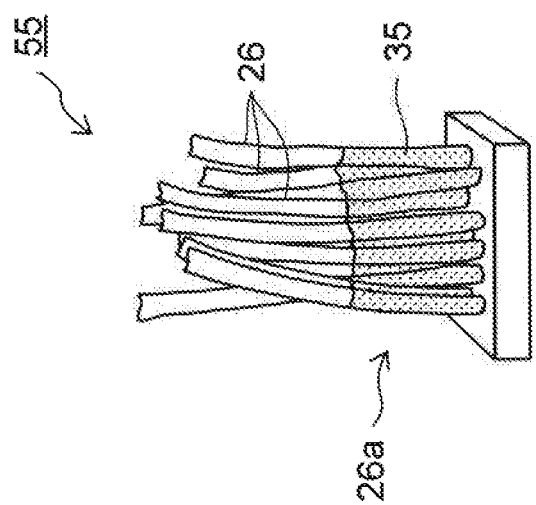
FIG. 8A is a diagram drawn based on an SEM image of a heat dissipating sheet according to the present embodiment having resin films whose thicknesses are 10 μm.

FIG. 8A is a diagram drawn based on an SEM image of a heat dissipating sheet 55 in which the thicknesses of the resin films 34 and 35 are 10 μm.

As illustrated in FIG. 8A, in this case as well, the one end portion 26a of the carbon nanotube 26 is covered with the second resin film 35, and the portion of the carbon nanotube 26 locating higher than the one end portion 26a is uncovered with the second resin film 35 and exposed from the second resin film 35.

FIG. 8B is a schematic sectional view of the heat dissipating sheet 55 in this case.

As illustrated in FIG. 8B, the end portions 26b and 26a of the carbon nanotube 26 are in contact with the component 33 and 43 respectively.

Figure 9B:
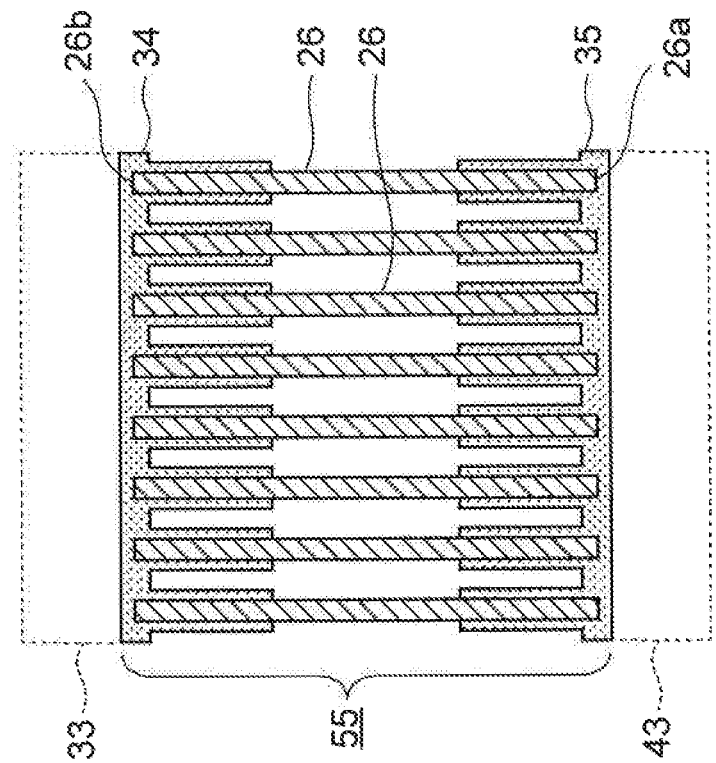
FIG. 9B is a schematic sectional view of the heat dissipating sheet according to the present embodiment having resin films whose thicknesses are 20 μm.
Figure 9A:
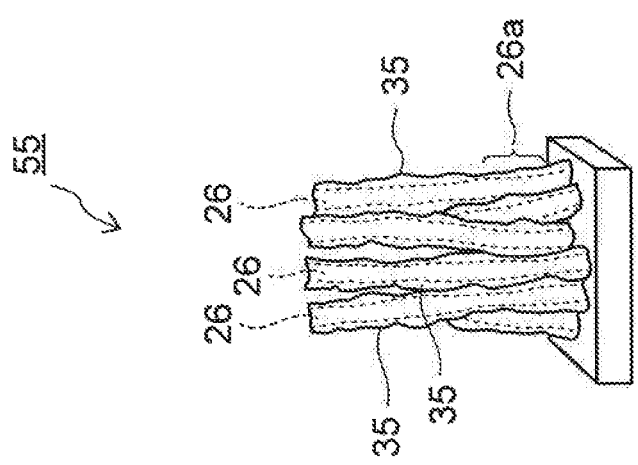
FIG. 9A is a diagram drawn based on an SEM image of a heat dissipating sheet according to the present embodiment having resin films whose thicknesses are 20 μm.

On the other hand, FIG. 9A is a diagram drawn based on an SEM image of a heat dissipating sheet 55 in which the thicknesses of the resin films 34 and 35 are 20 μm. Then, FIG. 9B is a schematic sectional view of the heat dissipating sheet 55 in this case.

As illustrated in FIG. 9A, in this case, the portion of the carbon nanotube 26 locating higher than the one end portion 26a is covered with the second resin film 35.

As a result, the elasticity of the carbon nanotube 26 is deteriorated by the second resin film 35, which makes it difficult for the carbon nanotube 26 to accommodate to the uneven surfaces of the components 33 and 43, which may causes the heat dissipating sheet 55 to peel off from the components 33 and 43.

Moreover, as illustrated in FIG. 9B, the second resin film 35 exists thickly on the surface of the second component 43 in this case. Therefore, the second resin film remains between the end portion 26a of the carbon nanotube 26 and the second component 43, which increases the thermal resistance between the heat dissipating sheet 55 and the second component 43.

According to these investigation results, it is preferable to set the thicknesses of the resin films 34 and 35 to equal to or thinner than 10 μm, for the purpose of maintaining the elasticity of the carbon nanotubes 26, as well as excluding the resin films 34 and 35 from the portion between the end portions 26a and 26b and components 33 and 43.

In the meantime, the surface density of the carbon nanotubes 26 is increased in the step of FIG. 3F in the present embodiment.

According to the investigation conducted by the inventor of the present application also revealed that, by increasing the surface density of the carbon nanotubes 26 in this manner, the thermal conductivity of the heat dissipating sheet 55 increases approximately 60% than in the case where the surface density of the carbon nanotubes 26 is not increased.

Moreover, the investigation conducted by the inventor of the present application also revealed that, by increasing the surface density of the carbon nanotubes 26, the mechanical strength of the heat dissipating sheet 55 improved.

Figure 11B:
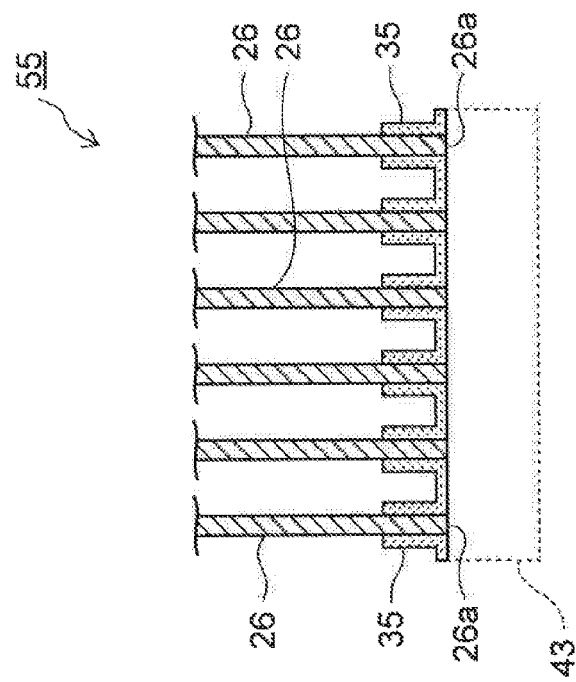
FIG. 11B is an SEM image of the heat dissipating sheet that is subjected to the step of FIG. 3F.
Figure 11A:
FIG. 11A is a schematic sectional view of a heat dissipating sheet that is subjected to the step of FIG. 3F.

FIGS. 11A to 11B are diagrams illustrating the investigation results.

Figure 10B:
FIG. 10B is an SEM image of the heat dissipating sheet that is not subjected to the step of FIG. 3F.
Figure 10A:
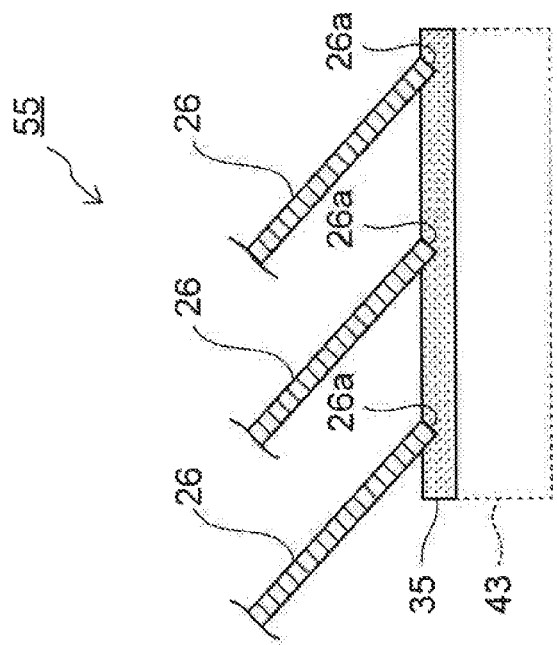
FIG. 10A is a schematic sectional view of a heat dissipating sheet that is not subjected to the step of FIG. 3F.

FIG. 10A is a schematic sectional view of a heat dissipating sheet 55 that is not subjected to the step of FIG. 3F, and the FIG. 10B is an SEM image of this heat dissipating sheet 55.

As illustrated in FIGS. 10A and 10B, since the density of the carbon nanotubes 26 is low in this case, the carbon nanotubes 26 buckle under the pressure from the pressing plates 51 and 52 in the step of FIG. 3L. As a result, the softened second resin film 35 cannot climb up the side surface of the carbon nanotube 26, so that the second resin film 35 remains between the end portion 26a of the carbon nanotube 26 and the second component 43.

On the other hand, FIG. 11A is a schematic sectional view of a heat dissipating sheet 55 that is subjected to the step of FIG. 3F according to the present embodiment, and the FIG. 11B is an SEM image of this heat dissipating sheet 55.

As illustrated in FIGS. 11A and 11B, since the density of the carbon nanotubes 26 is increased in this case, mechanical strength of the heat dissipating sheet 55 is increased to the extent that the carbon nanotubes 26 does not buckle under the pressure from the pressing plates 51 and 52 in the step of FIG. 3L.

Moreover, it was also revealed that by preventing the carbon nanotubes 26 from buckling, the softened second resin film 35 can easily climb up the side surface of the carbon nanotube 26, so that the second resin film 35 is unlikely to remain between the end portions 26a and the second component 43.

Although, the present embodiment is described in detail, the present embodiment is not limited to the above.

For example, although the heat spreader is used as the first component 33 and CPU is used as the second component 43, any components located in a heat dissipation path may be used as the component 33 and 34, and these component may be connected each other via the heat dissipating sheet 55.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing an electronic device, the method comprising:
   placing a resin film with a first thickness on a component; and
   while heating the resin film to be softened, pressing end portions of a plurality of carbon nanotubes against the softened resin film to bring the end portions into contact with the component, and causing the softened resin film to climb up side surfaces of the carbon nanotubes so that a first portion of each of the carbon nanotubes is covered with the resin film, and the first portion has a first length,
   wherein the first length is greater than the first thickness, and intermediate portions of the carbon nanotubes other than the first portions are uncovered with and exposed from the resin film.

2. The method of manufacturing an electronic device according to claim 1, wherein a thickness of the resin film before the heating is greater than or equal to 2 μm and less than or equal to 10 μm.

3. The method of manufacturing an electronic device according to claim 1, further comprising:
   increasing a surface density of the carbon nanotubes before the heating.

4. The method of manufacturing an electronic device according to claim 3, wherein the increasing the surface density of the carbon nanotubes includes:
   pressing a rubber sheet that is stretched from a natural length thereof against either one of both ends of the carbon nanotubes, thereby fixing the carbon nanotubes to the rubber sheet; and
   after fixing the carbon nanotubes to the rubber sheet, relaxing the rubber sheet.

5. The method of manufacturing an electronic device according to claim 1, wherein the resin sheet is a thermosetting resin.

6. The method of manufacturing an electronic device according to claim 5, wherein in the heating of the resin film, the resin film is heated to a temperature equal to or higher than a melting point of the resin film.

* * * * *